US005580269A

United States Patent [19]
Fan

[11] Patent Number: 5,580,269
[45] Date of Patent: Dec. 3, 1996

[54] SURFACE MOUNT CONNECTOR

[75] Inventor: Leong S. Fan, Singapore, Singapore

[73] Assignee: The Whitaker Corporation, Wilmington, Del.

[21] Appl. No.: 338,930

[22] Filed: Nov. 14, 1994

[30] Foreign Application Priority Data

Dec. 29, 1993 [JP] Japan .................................... 5-351402

[51] Int. Cl.[6] ................................ H01R 9/09; H05K 1/00
[52] U.S. Cl. ................................................ 439/79
[58] Field of Search ................................ 439/78, 79, 83, 439/381, 540, 607

[56] References Cited

U.S. PATENT DOCUMENTS

| | | | |
|---|---|---|---|
| 4,550,962 | 11/1985 | Czeschka | 439/78 |
| 4,583,807 | 4/1986 | Kaufman et al. . | |
| 5,336,109 | 8/1994 | Hillbish et al. | 439/540 |
| 5,346,404 | 9/1994 | Shimada | 439/108 |
| 5,433,624 | 7/1995 | Tabata | 439/79 |
| 5,453,016 | 9/1995 | Clark et al. | 439/79 |

FOREIGN PATENT DOCUMENTS

| | | |
|---|---|---|
| 1-279581 | 11/1989 | Japan . |
| 9028236 | 6/1990 | Japan . |

*Primary Examiner*—Gary F. Paumen
*Assistant Examiner*—Yong Kim

[57] ABSTRACT

The surface mounted connector (50) comprises a housing (60), a number of contacts (70) and an arranging beam (80). The housing (60) is mounted on the base board, and the arranging beam (80) is inserted in the guiding grooves (67) made in the mounting legs (66) located at both ends of the narrow and long body (61). When the arranging beam (80) is inserted in place, it arrays the soldering tails (72) and (74) of the contacts (70) so that they become located in one plane. It is also preferable that the beam press the soldering tails to the pads of the base board.

11 Claims, 3 Drawing Sheets

Fig. 2
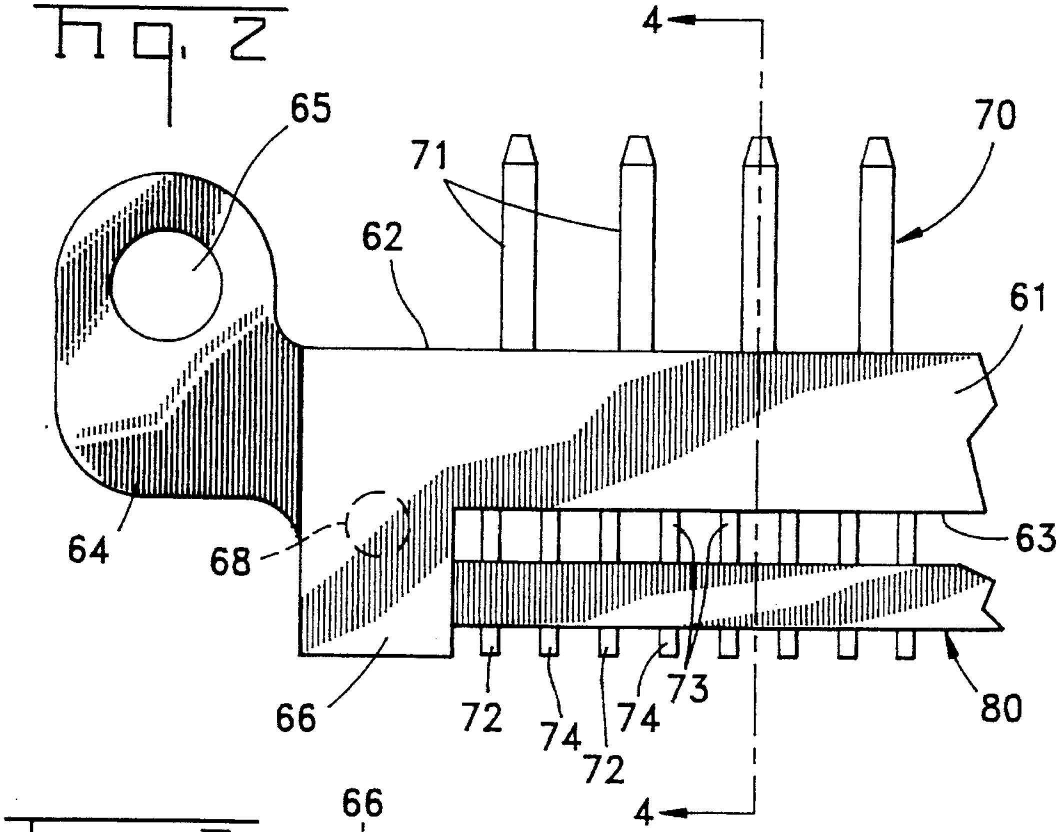
Fig. 3
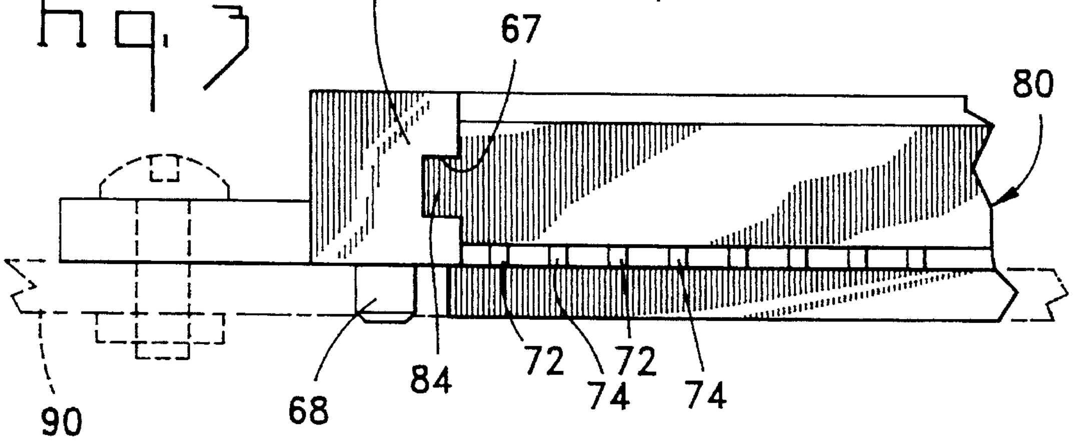
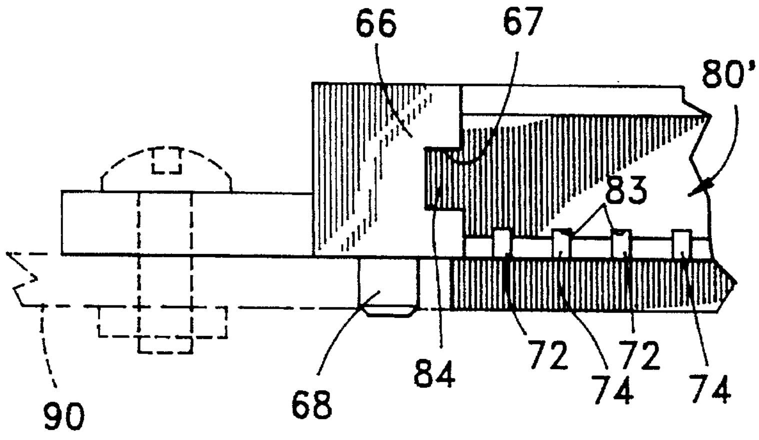
Fig. 3A

SURFACE MOUNT CONNECTOR

FIELD OF THE INVENTION

This invention relates to electrical connectors, especially to surface mounted connectors having a number of contacts or terminals which are connected by soldering to the pads of the circuit boards using surface mounting technology.

BACKGROUND OF THE INVENTION

Recent trends in electronic devices and electronic equipment call for portability and miniaturization (that is for light and small-size devices). In order to attain the miniaturization goals and to improve serviceability, not only active and passive parts, but also electromechanical elements (such as connectors and switches) undergo considerable improvements, especially in the field of home electronics. SMT-type elements are especially effective for these purposes and they are widely used in the devices where small size and high mounting density are especially important. As it is well known in the art, the surface mounting technology comprises applying a layer of soldering cream on the pads of the base boards or printed circuit boards to which terminals or soldering tails of electronic elements are pressed against the pads. After that, the pads are heated (for example by infra red radiation) to a temperature above the melting point of the solder, thus soldering the two elements together.

An example of a conventional surface mounted connector (below, SMT connector) can be found in the Japanese patent publication No. 90-28236 related to U.S. Pat. No. 4,583,807 filed by AMP Incorporated. This connector has a narrow long housing with several rows of contacts which are fixed to the base board. Soldering tails of these contacts are bent in such a manner that they form a surface coincident with that of the soldering pads formed on the base board. However, with an increase in the number of contacts and in their density, it becomes difficult to keep all soldering sections of the soldering tails in one plane. In addition, there is danger that the contacts will be deformed during the handling of the connectors manually or by means of robotics arms.

A solution making it possible to eliminate this disadvantage which comprises the use of a part determining the position of the soldering tails to align them with the soldering pads of the base board is known in the art. An example of such a solution can be found in the Japanese patent publication No. 89-279581 related to U.S. Pat. No. 4,583, 807 filed by AMP Incorporated. In this specific example, soldering tails of contacts arrayed in two rows are bent in a certain configuration as shown in FIGS. 5 and 6.

This conventional SMT connector comprises a housing 10 and two rows of contacts 11 inserted in the contact channels 14 provided in the housing. Part 21 restricting soldering tails is inserted in the recesses 25 made in the opposite end walls 16 in such a manner that it (the part 21) can move. This part 21 restricting the soldering tails has one row of the openings 22 into which free ends of the soldering tails 18 of the lower contacts 11 are inserted, and channels (or grooves) 23 into which free ends of the soldering tails 18 of the upper contacts 11 are inserted. This configuration makes it possible to keep all the soldering portions 19 of the soldering tails 18 of the contacts 11 aligned with the soldering pads 30 of the base board.

However, the assembly of the SMT connector shown in FIGS. 5 and 6 represents certain difficulties. The insertion of the soldering tails 18 of the lower row contacts 11 into the openings 22 of the housing 10 and the correct placement of the soldering tails 18 of the upper row contacts 11 in the channels 23 made in the bottom of the part 21 restricting movement of the soldering tails becomes an extremely difficult, time-consuming operation, especially with an increase in the number of the soldering tails or in their density (in other words, in the SMT connectors intended for miniaturized devices having a high density of element mounting).

Therefore, the purpose of this invention is to offer an SMT connector in which it is possible to maintain coplanarity of the soldering tails of a number of contacts and, at the same time, to provide appropriate pressure on the soldering tails when they are pressed against the soldering pads of the base board during soldering operation.

Another purpose of this invention is to offer an SMT connector which facilitates mounting operations by making it unnecessary to pay too much attention to the handling of the connectors.

BRIEF DESCRIPTION OF THE DRAWINGS

Embodiments of the present invention will be described with reference to the accompanying drawings, in which:

FIG. 2 is a top view of the SMT connector shown in FIG. 1.

FIG. 3 is a back view of the SMT connector shown in FIG. 1.

FIG. 3A is a back view of an alternative embodiment of the SMT connector.

DETAILED DESCRIPTION OF THE INVENTION

Figure 1:
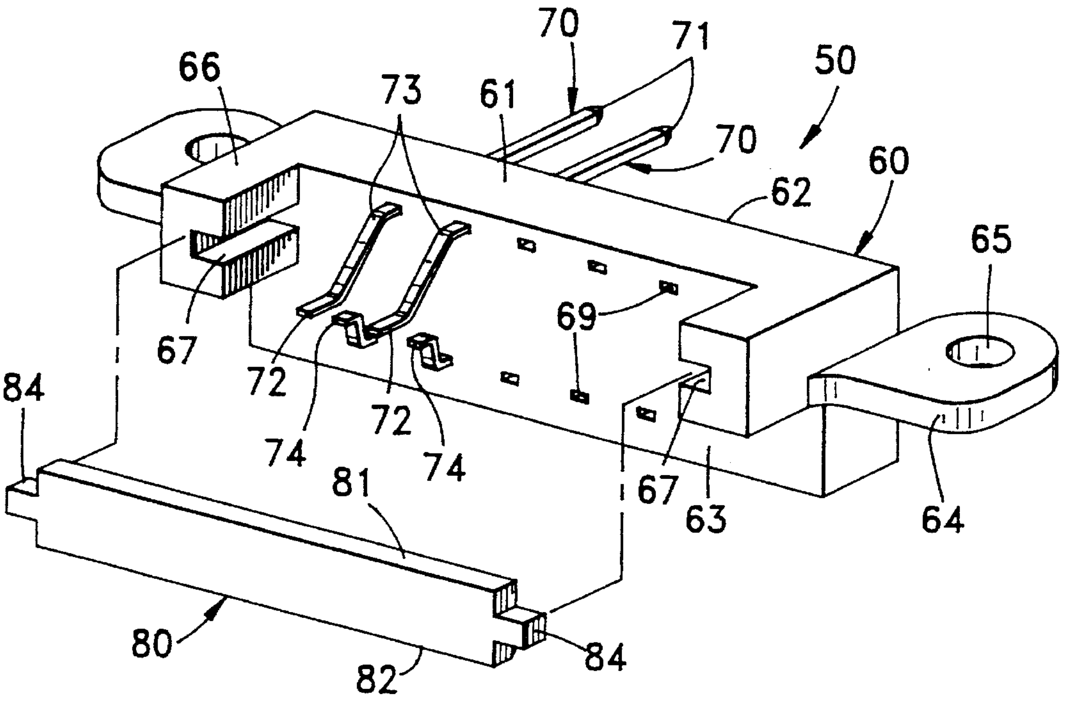
FIG. 1 is an exploded perspective view of the preferred embodiment of the SMT connector according to this invention.

The SMT connector 50 comprises a narrow long housing 60, contacts 70 arrayed in two rows and an arranging beam 80 which is provided for maintaining coplanarity of the contacts. As shown by a dotted line in FIG. 3, the SMT connector 50 is fixed to a base board 90 having a number soldering pads (not shown in the drawing) to which soldering tails of contacts 70 are soldered.

Figure 4:
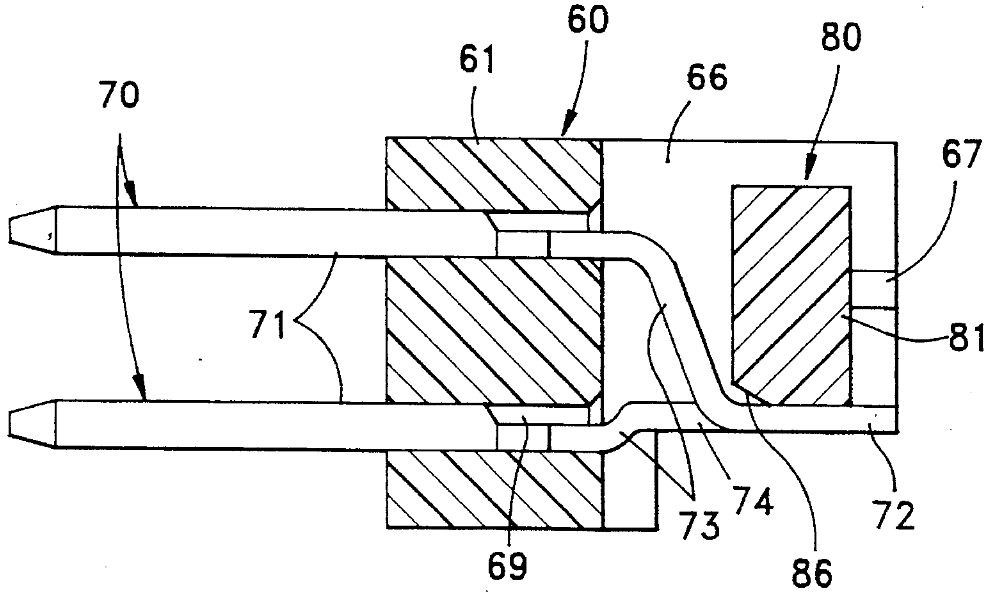
FIG. 4 is cross sectional view along the 4—4 line of the SMT connector shown in FIG. 2.
Figure 5:
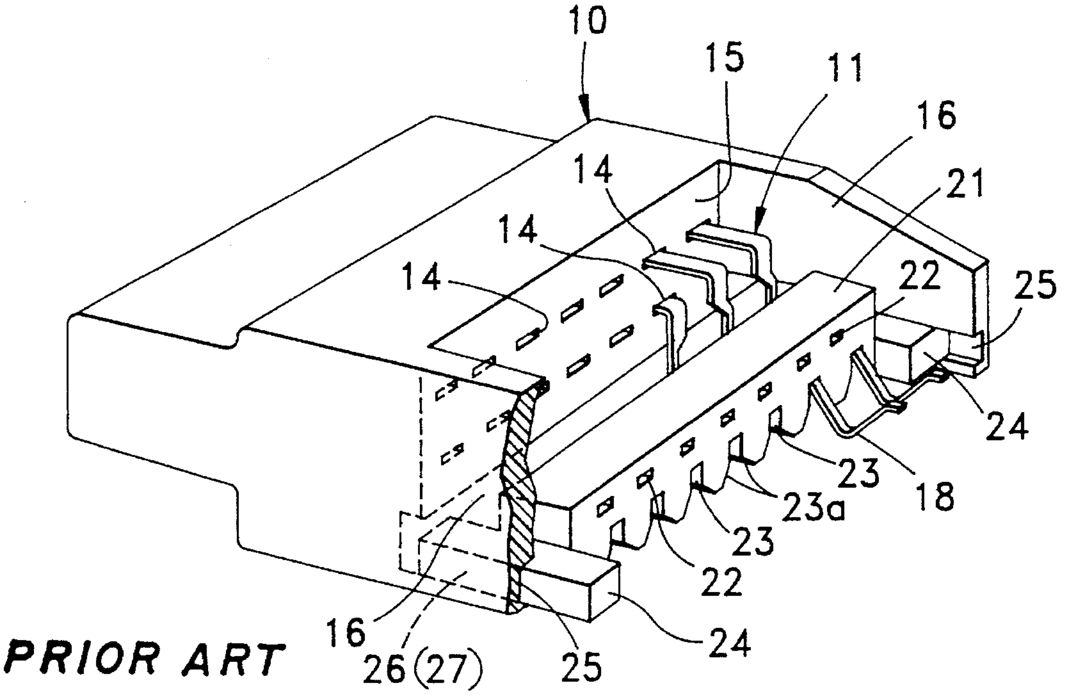
PRIOR ART Fig. 5
FIG. 5 is a perspective view of a conventional SMT connector.
Figure 6:
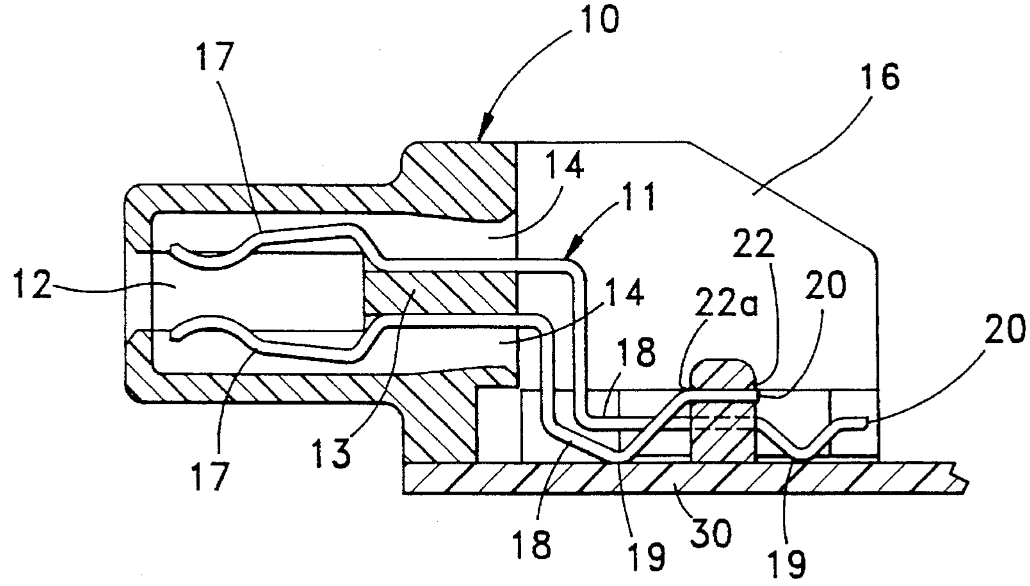
PRIOR ART Fig. 6
Fig. 6 is a cross sectional view of the connector in Fig. 5.

The housing 60 has a narrow and long body 61 with a front surface 62 and a back surface 63. At both ends of this body 61, flanges 64 are provided with openings 65 for the insertion of mounting bolts or other fixture. At the inside surface of the body 61, there are legs (or protrusions) 66 having guiding grooves or recesses 67. The housing 60 is preferably made as a single unit of nylon, a liquid-crystal polymer or other suitable engineering plastic by conventional molding. Contacts or terminals 70 are either pressed into the contact-insertion openings 69 made in two rows in the body 61 of the housing 60 and extending from the front surface 62 to the back surface 61 or secured by insert molding method. All contacts 70 include a contact post 71, which extends from the front surface 62 of the body 63 of the housing 60 and makes connection with a receptacle contact of a matching connector (not shown in the drawing), and of a soldering tail which extends from the back surface 63. The connector according to this invention may also have a protective shroud surrounding the contact posts 71 of the contacts 70 made along the periphery of the front surface 62 of the body 61 of the housing 60 (this feature is not depicted in the FIGS. 1 through 4). As it is known in the art, in addition to protection of the contact posts 71 of the contacts 70, this shroud may also play the role of a polarizing and locking element for proper and reliable connection with a matching connector. The contacts 70 are usually made from a 0.5 mm thick copper alloy sheet by stamping and forming. The soldering tails of the contacts 70 include flat soldering sections 72, 74 and inclined transitional (or intermediate) sections 73.

The arranging beam 80 is usually made by molding of the same material as the housing 60. In this specific embodiment, the arranging beam 80 has the main body 81 and lugs 84 located at both ends. The bottom 82 of the body 81 can be either flat or it can have a tapered section 86 at its front end to make its insertion easier. At the bottom 82 of the arranging beam 80', shallow grooves 83 corresponding to the soldering tails 72 and 74 of the contacts 70 may be made to keep adjacent soldering tails 72 and 74 at a uniform pitch from each other, see FIG. 3A. The depth of these grooves 83 should not exceed the thickness of the soldering tails 72 and 74 so that the bottom surface of the soldering tails 72 and 74 is above the bottom surface 82 of the arranging beam 80'.

The guiding grooves 67 of the housing 60 of the SMT connector 50 are made nearly parallel to the base board to which the connector is mounted. But if necessary they also can be made so that the back edge (the edge that is inserted first) is slightly higher than the front edge. In such an arrangement, the soldering tails 72 and 74 of the contacts 70 become slightly pressed against soldering pads of the base board when the arranging beam 80 is inserted in place. FIGS. 2 and 3 depict the operation when the arranging beam 80 is snapped in the housing 60, with the housing being mounted to the base board 90. In such a configuration, all soldering tails 72 and 74 can be properly soldered to the pads of the base board. It is preferable to provide positioning posts 68 molded at the bottom surface of the housing 60 which are inserted in the alignment holes provided in the base board 90 (as shown in the FIG. 3) thus maintaining a proper alignment of the soldering tails and the pads.

Above, we gave a detailed description of a preferred embodiment of the SMT connector 50 according to this invention. However, it should be understood that this invention is not limited to this embodiment only, but it can be modified in various ways without deviating from its technical areas. In the embodiment represented in the FIGS. 1 through 4, the contacts 70 are arrayed in the body 61 of the housing 60 in two (upper and lower) rows. But this arrangement of the contacts 70 in two rows is not essential, and they may be arrayed in one or three or more rows. It is also possible to use for the attachment of the SMT connector 50 to the base board instead of the bolts passed through the openings made in the mounting lugs as in this embodiment, a flat springy metal fixture or an integral fixture molded together with the housing and located at its bottom. In addition, the lugs made at the ends of the arranging beam may be made round which will make it possible to rotate the beam within the guiding grooves to press the soldering tails against the pads.

As follows from the above explanations, the design and mounting of the SMT connector according to this invention are extremely simple, and this design can be easily used in small connectors used for devices with a high mounting density. And since all the soldering tails are properly arranged relative to the base board, the soldering operations can be performed with a great precision and a high reliability. The arranging beam can be removed after the completion of the soldering for the purposes of visual inspection or correction of wrong connections. Therefore, the SMT connectors according to this invention are very effective for such applications as, for example, small hard disk drives (HDD).

What is claimed is:

1. A surface mount connector, comprising:

a housing having a front section and a back section;

contacts disposed in said housing and having connection sections for electrical connection with a matable connector and planar solder tails extending from the back section, each of said solder tails having a board mountable surface and an opposed board remote surface;

an aligning member attachable to the back section of said housing, said aligning member having a bottom surface and being disposed over said board remote surfaces opposed to the board mounting surfaces of the solder tails and engaging and maintaining the board mountable surfaces of the solder tails coplanar along the bottom surface thereof during surface mount soldering of the solder tails to a circuit board.

2. The connector of claim 1, wherein said housing has mounting flanges with openings for mounting said housing to the circuit board.

3. The connector of claim 1, wherein the back section has protrusions with guide grooves therein for guiding said aligning member into position over the solder tails.

4. The connector of claim 3, wherein said aligning member has lugs on ends thereof, the lugs fit into the guide grooves for guiding said aligning member into position over the solder tails.

5. The connector of claim 4, wherein said aligning member has a tapered section directed towards the solder tails to make placement of said aligning member over said solder tails easier.

6. The connector of claim 4, wherein said contact sections are disposed in two rows in the front section of said housing.

7. The connector of claim 6, wherein the solder tails are flat and said contacts include transitional sections between the flat solder tails and the connection sections.

8. The connector of claim 7, further comprising a positioning post on a bottom of said housing which is inserted into an alignment hole in the circuit board.

9. The connector of claim 6, wherein said solder tails are approximately in horizontal alignment prior to placement of said aligning member.

10. The connector of claim 1, wherein said aligning member has slots disposed along the bottom surface of said aligning member for maintaining the solder tails at a correct pitch from each other, the slots having a depth less than the height of the solder tails so that the solder tails extend below the bottom surface for soldering with the circuit board.

11. The surface mount connector of claim 1 wherein said aligning member engages said board remote surfaces at the same axial location and opposed to the board mounting surfaces of the solder tails.

* * * * *